US007295458B2

(12) United States Patent
Chan et al.

(10) Patent No.: US 7,295,458 B2
(45) Date of Patent: Nov. 13, 2007

(54) EIGHT TRANSISTOR SRAM CELL WITH IMPROVED STABILITY REQUIRING ONLY ONE WORD LINE

(75) Inventors: Yuen H. Chan, Poughkeepsie, NY (US); William V. Huott, Holmes, NY (US); Donald W. Plass, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/334,647

(22) Filed: Jan. 18, 2006

(65) Prior Publication Data

US 2007/0165445 A1    Jul. 19, 2007

(51) Int. Cl.
G11C 11/00    (2006.01)
(52) U.S. Cl. .................... 365/154; 365/155; 365/156; 365/190
(58) Field of Classification Search ................ 365/154, 365/155–156, 190
See application file for complete search history.

(56) References Cited

U.S. PATENT DOCUMENTS

| 5,384,730 | A | 1/1995 | Vinal ......................... 365/156 |
| 5,386,379 | A | 1/1995 | Ali-Yahia et al. ............. 365/49 |
| 6,556,487 | B1 | 4/2003 | Ratnakumar et al. .. 365/189.08 |
| 6,563,730 | B1 | 5/2003 | Poplevine et al. .......... 365/154 |
| 6,831,853 | B2 | 12/2004 | Lin et al. .................... 365/154 |
| 2007/0035986 | A1* | 2/2007 | Houston ..................... 365/154 |

* cited by examiner

Primary Examiner—Richard T. Elms
Assistant Examiner—Pho M. Luu
(74) Attorney, Agent, or Firm—Lynn L. Augspurger; Laurence J. Marhoefer

(57) ABSTRACT

An SRAM cell that is accessed by a single word line and separate access transistors for read and write operations. A pair of write bit line transfer devices provide respectively access to the right and left sides of cross coupled pull-up, pull-down transistor pairs for a write operation, and a single read bit line transistor in series with the word line transistor, when selected, reads the content of the cell.

11 Claims, 2 Drawing Sheets

EIGHT TRANSISTOR SRAM CELL WITH IMPROVED STABILITY REQUIRING ONLY ONE WORD LINE

CROSS-REFERENCE TO RELATED APPLICATIONS

This application contains subject matter that is related to the subject matter of the following co-pending applications, each of which is assigned to the same assignee as this application, International Business Machines Corporation of Armonk, N.Y. Each of the below listed applications is hereby incorporated herein by reference in its entirety.

TRADEMARKS

IBM® is a registered trademark of International Business Machines Corporation, Armonk, N.Y., U.S.A. S/390, Z900 and z990 and other names used herein may be registered trademarks, trademarks or product names of International Business Machines Corporation

BACKGROUND OF THE INVENTION

1. Field of the Invention

This invention relates to an improved Static Random Access Memory (SRAM) cell and more particularly to stable cell with only one word line.

2. Description of the Background

Typical prior art CMOS SRAM cells have a six-transistor typology, such as that shown in FIG. 1. Two P channel field effect transistors (PFETs) P1 and P2 act as pull up transistors and two N channel field effect transistors (NFETs) N1 and N2 act as pull down transistors. Two NFETs N3 and N4 serve as pass gates to control access to the cell for reading and writing to the cell. These pass gates N3 and N4 are connected to a word line WL. P1 and N1 form an inverter and P2 and N2 form another inverter. As shown these invertors are cross-coupled to form a bi-stable cell.

An SRAM array has n rows and m columns of SRAM cells with cells of a row sharing a single word line WL and cells of a column sharing a pair of bit lines BLL and BLR. During standby, all of the word lines WL are low (i.e., at GND) and all bit lines are biased to the voltage level of the power supply Vdd. Thus, the pass-gate transistors of each cell are shut off. A cell state representing a 1 data bit, for example, is established with P1 and N2 on and P2 and N1 off so that the node L at the left of the cell is high (Vdd) and the node R at the right of the cell is low (GND). With P1 and N2 off and P2 and N1 on, node L is low and node R is high. During access time to the SRAM array a row is selected by driving its word line WL high to Vdd, which turns on half of the pass gates connected to that word line; namely, those connected to a high node. Thus, for each cell along a word line, one pass gate is turned on.

During a read access, a cell in a selected column, where its bit lines precharge devices are turned off, pulls down one of the bit lines (BL or BR) from its pre-charged high state (Vdd) by the "ON" passgate of the full selected cell (one that is selected in both the word and column dimension). A sense amplifier detects the differential voltage between the bit lines and generates an output. The cells along a selected word line likewise generate a differential voltage, but these signals are ignored. These cells along a selected word line that are not selected by the columns are commonly referred to as "half selected" cells. Unselected columns could have their bit line precharge devices either turned off or stayed on, depending on the design preference.

High performance designs, such as for cache where read and write operations are performed within a short clock cycle, cell beta ratios that are typically in a range between 2.2 and 3.5 in order to avoid unintended changes in the state of a cell due to a so called "half-selected cell disturbance". The beta ratio is a function of the ratio of the channel resistance of the pass gate transistor to the channel resistance of the pull down transistor. Half-selected cell disturbance occurs when a word line connected to a memory cell of unselected columns with bit lines biased to a predetermined Vdd is activated. This causes the body voltage of a pass-gate transistor of a non-selected cell to be more conductive than the cell pull down transistor, there by causing the ground state node ("0" node) to switch states and disrupt the state of the memory cell.

In fast switching environments a high beta ratio improves the margin preventing half-selected cell disturbances. However a higher beta ratio results in decreased cell performance, such as slower write. Particularly, sub 100 nm silicon technologies are having increased problems with cell SRAM cell stability when trying to write to the cells at high rates due to the inherent variations in individual cell beta ratios as a result to limitations in the degree to which device channel parameters can be controlled at these extremely small devices sizes.

Adding additional transistors to the basic six-transistor SRAM cell have been proposed in the prior art in order to prevent half-selected cell disturbance by providing separate access paths for reading and writing. However these prior art proposals have not proven satisfactory. Particularly, as they employ two separate word lines, one for writing and one for reading.

SUMMARY OF THE INVENTION

An object of this invention is the provision of an improved SRAM cell that provides cell stability, with reduced cell area requirements without impacting the writing speed to the cell.

Another object of the invention is the provision of an improved SRAM cell with separate cell access paths for reading and writing and only a single word line.

Briefly, this invention contemplates the provision of an SRAM cell that is accessed by a single word line and separate access transistors for read and write operations. A pair of write bit line transfer devices provide respectively access to the right and left sides of cross coupled pull-up, pull-down transistor pairs for a write operation, and a single read bit line transistor in series with the word line transistor, when selected, reads the content of the cell.

DESCRIPTION OF THE DRAWINGS

The subject matter, which is regarded as the invention, is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Figure 1:
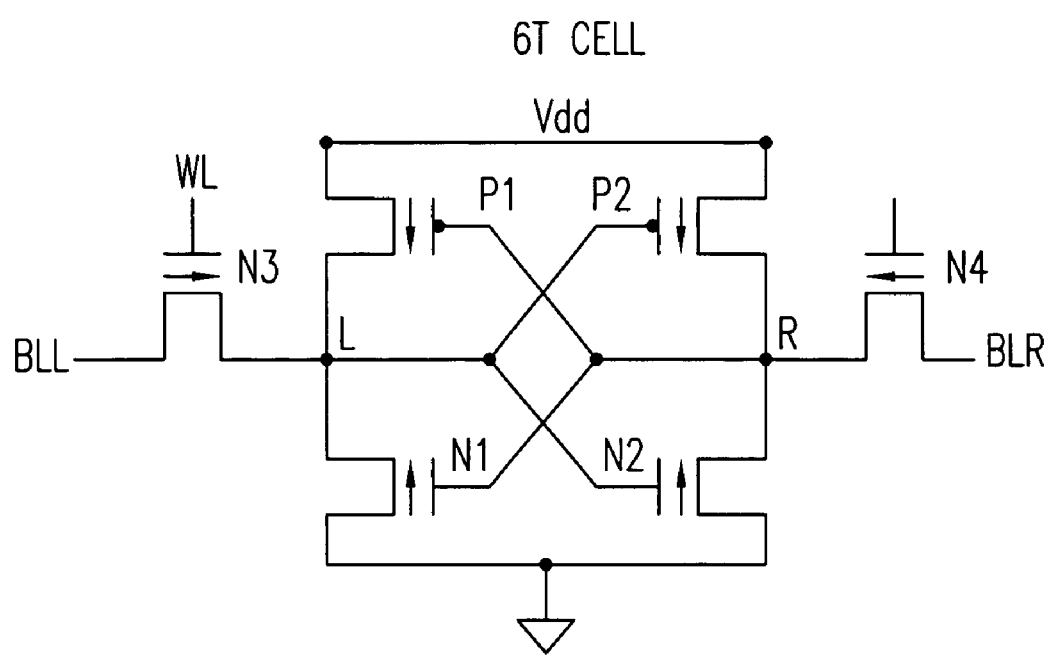
FIG. 1 is a schematic diagram of a typical prior art-six transistor SRAM CELL.
Figure 2:
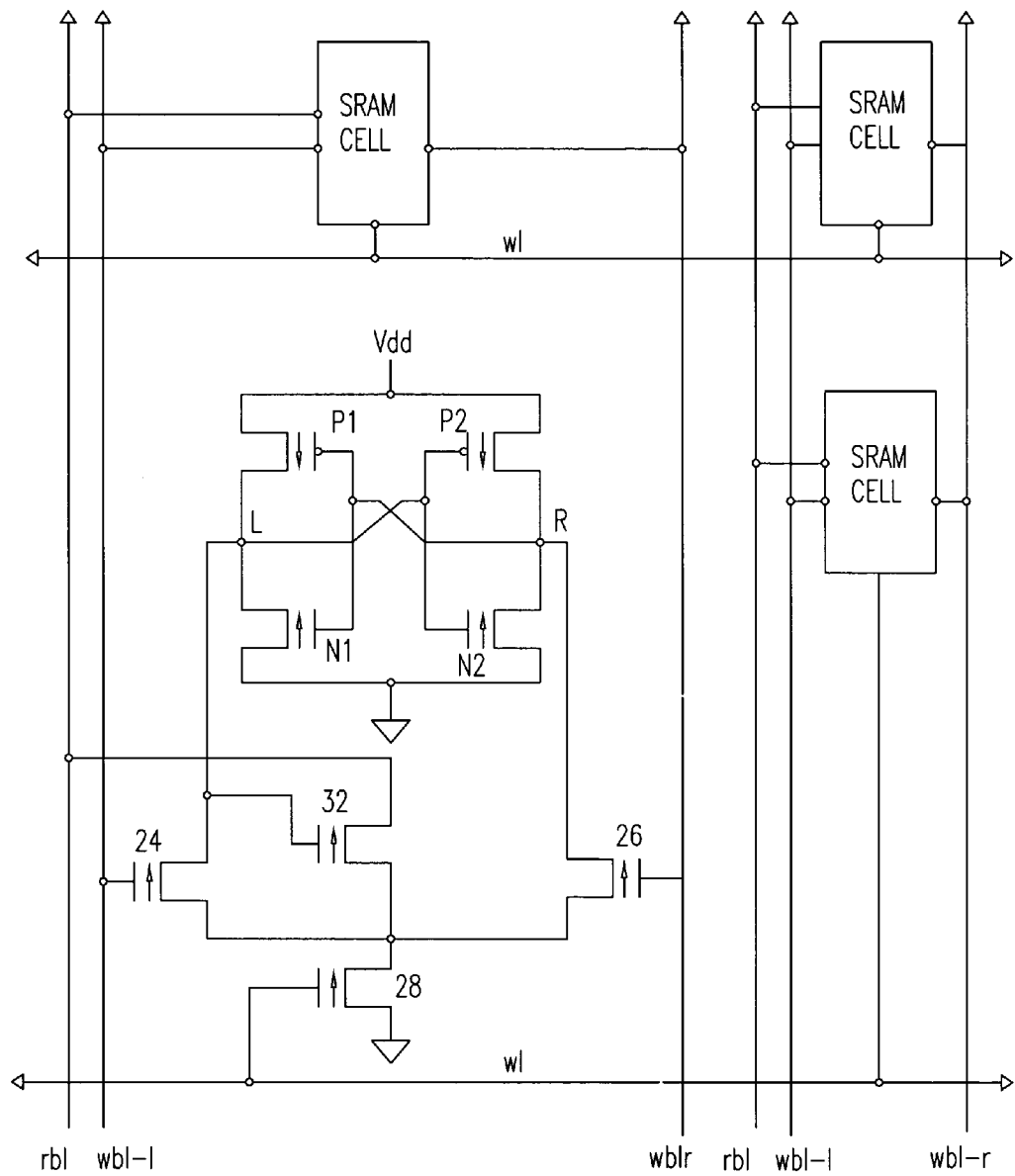
FIG. 2 is a schematic diagram of one embodiment of an SRAM cell in accordance with the teachings of this invention.

Referring now to FIG. 2 of the drawings, the part of the cell comprised of PFET pull-up transistors P1 and P2 and NFET pull-down transistors N1 and N2 connected to nodes R and L is the same as the corresponding part of the prior art cell discussed above, where like reference numbers are used, and will not be further explained here. In accordance with the teachings of this invention, a pair of NFET write access transistors 24 and 26 provides access to the nodes R and L in a write operation. The source of the left hand NFET 24 is connected to the left node L and the source of the right hand NFET 26 is connected to the right node R. The drains of NFET 24 and 26 are connected to ground (i.e. common) via a word line NFET 28 whose source is connected to the drains of NFET 24 and 26 and whose drain is connected to ground. The gate of the left write access NFET 24 is connected to a normally low left write bit line wbl_l and the gate of the right write access NFET 26 is connected to a normally low right write bit line wbl_r. The write bit access lines wbl_l and wbl_r are common to all of the cells in a column and are coupled to word line control logic, not shown. The gate of the word line NFET 28 is connected to a word line w1 that is common to all the cells in a row and is connected to word line control logic, not shown.

Read access to the cell nodes L and R is provided by a read access NFET 32 whose drain is connected to ground via the word line NFET 28 and whose source is connected to a read bit line rb1, which is common to all the cells in a column and is coupled to control logic and a sense amplifier, not shown. The gate of NFET 32 is connected to the node L in this exemplary embodiment.

In operation, in order to write to the cell, one of the normally low write bit lines wbl_l or wbl_r is brought high while the other write bit line remains in its normally low state. Concurrently, the word line w1 is brought high. The node (L or R) connected to write access NFET (24 or 26) whose gate is high is therefore connected to ground through that write access NFET and the word line NFET 28. If the node is in a high state, it is pulled down, causing the cell to change states. If the node is in a low state, the cell maintains its existing state.

Similarly, in order to read the state of the cell, the read bit line r1 is precharged high before a read operation. Concurrently, the word line w1 is brought high so that the drain of read access transistor 32 is connected to ground via word line NFET 28. In this exemplary embodiment, with the gate of read access NFET 32 connected to the left node L, if the node L is in its high state, NFET 32 conducts, connecting the read bit line r1 to ground via NFET 28, thus providing a signal indicating the high state of that side of the cell. If node L is in a low state, NFET 32 does not conduct, and bit line r1 remains in its high state, thus providing a signal indicating the low state of that side of the cell.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A static random access memory comprising in combination:
    a plurality of bi-stable memory cells arranged in rows and columns;
    each of said plurality of memory cells includes a first pull-up transistor and a first pull-down transistor coupled in series between a supply voltage and common and cross coupled with a second pull-transistor and a second pull-down transistor connected in series between said supply voltage and common, and with a first node between said first pull-up transistor and said second pull-down transistor and a second node between said second pull-up transistor and said second pull-down transistor;
    cells in a column each connected via a pair of write access devices to a pair of write bit lines for writing data into said cell;
    said cells in a column each connected via a read access device to a read bit line, separate from said pair of write bit lines, for reading data from said cell; and
    cells in a row each connected via a word line access device to a single word line;
    whereby activation to respective predetermined states of said word line and said pair of write bit lines writes data to said cell and activation of said word line and said read bit line reads data from said cell.

2. A static random access memory as in claim 1, wherein said pair of write access devices are coupled respectively between said pair of write bit lines and said first and said second node and said read access device is connected between said read bit line and said first node.

3. A static random access memory as in claim 2, wherein said pair of write access devices are each an FET, said read access device is an FET and said word line access device is an FET.

4. A static random access memory as in claim 2, wherein said pair of write access devices are each an NFET, said read access device is an NFET and said word line access device is an NFET with the drains of said write access devices and the drain of said read access device connected to the source of said word line access device.

5. A static random access memory as in claim 1, wherein said pair of write access devices are each an NFET, said read access device is an NFET and said word line access device is an NFET with the drains of said write access devices and the drain of said read access device connected to the source of said word line access device.

6. A static random access memory as in claim 1, wherein said pair of write access devices are each an NFET, said read access device is an NFET and said word line access device is an NFET with the drains of said write access devices and the drain of said read access device connected to the source of said word line access device.

7. A static random access memory comprising in combination:
    a plurality of bi-stable memory means arranged in rows and columns;
    each of said plurality of bi-stable memory means includes a first pull-up transistor and a first pull-down transistor coupled in series between a supply voltage and common and cross coupled with second pull-transistor and a second pull-down transistor connected in series between said supply voltage and common and with a first node between said first pull-up transistor and said second pull-down transistor and a second node between said second pull-up transistor and said second pull-down transistor;

said memory means in a column each coupled to write access means for writing data into said cell;

said memory means in a column each connected a read access means separate from write access for reading data from said cell; and said memory means in a row each coupled to a word line access;

whereby activation to respective predetermined states of said word line means and said write access means writes data to said cell and activation of said word line means and said read access means reads data from said cell.

8. A static random access memory as in claim 7, wherein said write access means includes a pair of FETs coupled respectively between said pair of write bit lines and said first node and said second node and said read access means includes an FET connected between said read bit line and said first node.

9. A static random access memory as in claim 8, wherein said write access includes a pair of NFETs, said read access means is an NFET and said word line access means is an NFET with the drains of said write access NFETs and the drain of said read access NFET connected to the source of said word line NFET.

10. A static random access memory as in claim 7, wherein said write access includes a pair of NFETs, said read access means is an NFET and said word line access means is an NFET with the drains of said write access NFETs and the drain of said read access NFET connected to the source of said word line NFET.

11. A static random access memory as in claim 10, wherein said write access includes a pair of NFETs, said read access means is an NFET and said word line access means is an NFET with the drains of said write access NFETs and the drain of said read access NFET connected to the source of said word line NFET.

* * * * *